(12) United States Patent
Cabral, Jr. et al.

(10) Patent No.: US 7,183,182 B2
(45) Date of Patent: Feb. 27, 2007

(54) METHOD AND APPARATUS FOR FABRICATING CMOS FIELD EFFECT TRANSISTORS

(75) Inventors: Cyril Cabral, Jr., Ossining, NY (US); Meikei Ieong, Wappingers Falls, NY (US); Jakub T. Kedzierski, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/669,898

(22) Filed: Sep. 24, 2003

(65) Prior Publication Data

US 2005/0064636 A1 Mar. 24, 2005

(51) Int. Cl.
*H01L 21/425* (2006.01)
(52) U.S. Cl. .................... 438/517; 438/682
(58) Field of Classification Search ............ 257/382, 257/384, E21.438; 438/517, 530, 682, 649
See application file for complete search history.

(56) References Cited

U.S. PATENT DOCUMENTS

| 6,100,173 | A | 8/2000 | Gardner et al. | |
|---|---|---|---|---|
| 6,365,446 | B1 * | 4/2002 | Chong et al. | 438/197 |
| 6,458,678 | B1 | 10/2002 | Spikes, Jr. et al. | |
| 6,518,113 | B1 * | 2/2003 | Buynoski | 438/217 |
| 6,534,837 | B1 | 3/2003 | Bai et al. | |
| 6,544,829 | B1 * | 4/2003 | Gopinath et al. | 438/232 |
| 6,599,831 | B1 * | 7/2003 | Maszara et al. | 438/649 |
| 6,624,489 | B2 * | 9/2003 | Chong et al. | 257/413 |
| 6,653,700 | B2 * | 11/2003 | Chau et al. | 257/412 |
| 6,777,317 | B2 * | 8/2004 | Seibel et al. | 438/486 |
| 2002/0053711 | A1 | 5/2002 | Chau, et al. | |
| 2002/0056874 | A1 * | 5/2002 | Ohtake et al. | 257/336 |
| 2003/0092249 | A1 | 5/2003 | Hsu, et al. | |
| 2003/0096471 | A1 * | 5/2003 | Lee et al. | 438/232 |
| 2003/0096491 | A1 * | 5/2003 | Hizawa | 438/581 |

OTHER PUBLICATIONS

Vaidya et al., Effect of dopant implantation on the properties of TaSi$_2$/poly-Si composites, *J. Vac. Sci. Technol. B*, 3 (May/Jun. 1985) 846.*
Kedzierski, et al., "Metal-gate FinFET and fully-depleted SOI devices using total gate silicidation," International Electron Devices Meeting, Conference Digest, Dec. 2002, pp. 247-250.
Krivokapic, et al., "Nickel Silicide Metal Gate FDSOI Devices with Improved Gate Oxide Leakage," IEDM 2002, pp. 271-274.
Maszara, et al., "Transistors with Dual Work Function Metal Gates by Single Full Silicidation (FUSI) of Polysilicon Gates," AMD 2002 Analyst Meeting, Nov. 7, 2002.
Qin, et al., "Investigation of Polycrystalline Nickel Silicide Films as a Gate Material," J. the Electrochemical Soc., 148(5), G271-G274, (2001).
PCT International Search Report and Written Opinion, EPO International Searching Authority, Mail Date Dec. 15, 2004.

* cited by examiner

*Primary Examiner*—Bradley K. Smith
(74) *Attorney, Agent, or Firm*—Patterson & Sheridan, LLP; Kin-Wah Tong, Esq.; Ido Tuchman, Esq.

(57) ABSTRACT

A method of fabricating complementary metal oxide semiconductor (CMOS) field effect transistors which includes selective doping and full silicidation of a polysilicon material comprising the gate electrode of the transistor. In one embodiment, prior to silicidation, the polysilicon is amorphized. In a further embodiment, siliciding is performed at a low substrate temperature.

14 Claims, 3 Drawing Sheets

METHOD AND APPARATUS FOR FABRICATING CMOS FIELD EFFECT TRANSISTORS

BACKGROUND OF THE INVENTION

1. Field of the Invention

The present invention generally relates to a method for fabricating devices on semiconductor substrates. More specifically, the present invention relates to a method of fabricating complementary metal oxide semiconductor (CMOS) field effect transistors on a semiconductor substrate.

2. Description of the Related Art

Integrated circuits (ICs) may include more than one million complementary metal oxide semiconductor (CMOS) field effect transistors that are formed on a semiconductor substrate and are wired together into circuits to perform various functions within the IC. A CMOS transistor comprises a gate structure disposed between source and drain regions that are formed in a semiconductor material. The gate structure generally comprises a gate electrode and a gate dielectric. The gate electrode is disposed over the gate dielectric and controls a flow of charge carriers in a channel region between the drain and source regions beneath the gate dielectric to turn the transistor on or off.

In high-speed and high device density ICs, conventional gate structures having polysilicon gate electrodes are inefficient because of a free carrier depletion layer in the polysilicon. In an ON state of the CMOS transistor, the depletion layer increases the effective thickness of the gate dielectric and, correspondingly, lowers capacitance of the gate structure, thereby degrading operational performance of the transistor.

For example, a lower gate capacitance negatively impacts the performance of the transistor. Specifically, high gate capacitance leads to a lower Vg-Vt (where Vg is the gate voltage and Vt is the threshold voltage) for the same number of on-state carriers and thus decreasing transistor power. Additionally, high gate capacitance also improves the scaling length of the device making it possible to build a smaller transistor, which has a faster switching speed.

In advanced CMOS transistors, gate structures may comprise silicide gate electrodes. In such gate structures, the polysilicon is converted to a silicide using a solid-state reaction with a metal or metallic alloy. A silicide is an compound of Si and a metal. Herein, materials are conventionally identified using their chemical formulas. In the gate structure, the silicide behaves like a metal and, as such, is able to eliminate the depletion effect.

However, it is desirable to have control over the effective work function of the metal-gate. The effective work function of the gate determines the threshold voltage of the transistor. A CMOS device is composed of two types of transistors; an n-type field effect transistor (nFET) and a p-type field effect transistor (pFET) each having a different threshold voltage and thus different workfunction. The workfunction of a metal is the energy necessary to remove an electron so that it is no longer bound to the metal (the energy difference between the vacuum level and Fermi level). For a CMOS device it is necessary to have dual metal gates with the appropriate workfunctions for each type of transistor.

Therefore, there is a need in the art for an improved method for fabricating CMOS field effect transistors in the manufacture of integrated circuits and for an improved method for controlling the work function of the metal-gate of a transistor.

SUMMARY OF THE INVENTION

In one embodiment, the present invention discloses a method of fabricating complementary metal oxide semiconductor (CMOS) field effect transistors that comprises selective doping and silicidation of a polysilicon material of a gate electrode of the transistor. In one embodiment, the dopants include at least one of As, P, B, Sb, Bi, In, Ti, Al, Ga, Ge, Sn and $N_2$. In a further embodiment, prior to silicidation, the polysilicon is amorphized. In yet another embodiment, silicidation is performed at a low substrate temperature.

Another aspect of the invention is a CMOS field effect transistor formed using the inventive method.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method for fabricating CMOS field effect transistors comprising silicide gate electrodes having a pre-determined and controlled work function. The method may be used to manufacture PMOS and NMOS transistors in ultra-large-scale integrated (ULSI) semiconductor devices and circuits.

Figure 1:
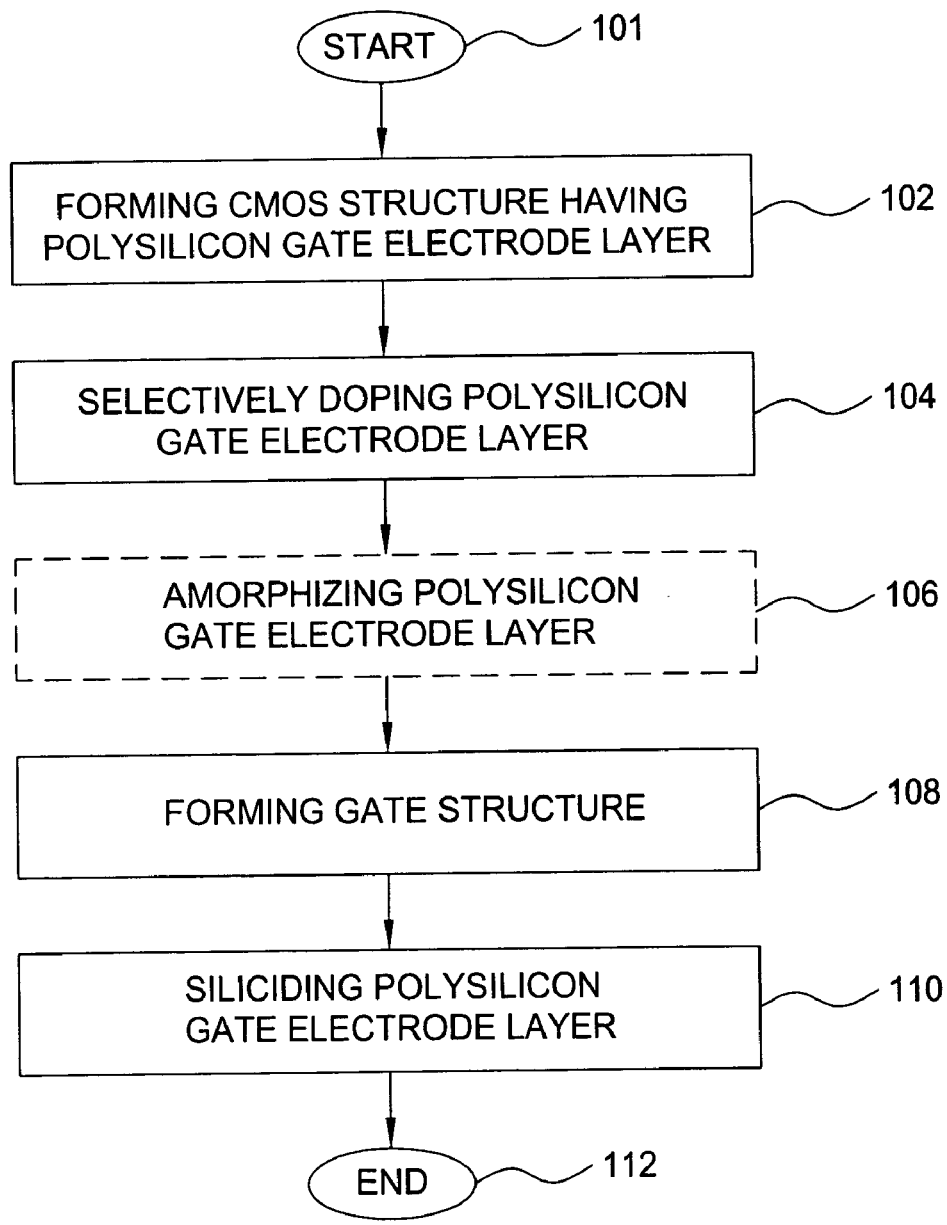
FIG. 1 depicts a flow diagram of a method for fabricating a CMOS field effect transistor in accordance with one embodiment of the present invention.

FIG. 1 depicts a flow diagram for one embodiment of the inventive method of fabricating CMOS field effect transistors as a method 100. The method 100 includes the processes that are performed upon a film stack of the transistor.

FIGS. 2A–2E depict schematic, cross-sectional views of a substrate showing the CMOS field effect transistor being fabricated using the method 100. The images in FIGS. 2A–2E are not depicted to scale and are simplified for illustrative purposes. To best understand the invention, the reader should simultaneously refer to FIGS. 1 and 2A–2E.

Figure 2C:
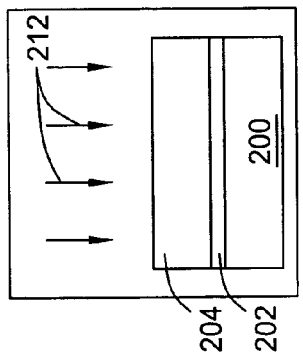
FIGS. 2A–2E depict a series of schematic, cross-sectional views of a substrate having the CMOS field effect transistor being fabricated in accordance with the method of FIG. 1.

The method 100 starts at step 101 and proceeds to step 102. At step 102, a polysilicon layer 204 (i.e., gate electrode layer) is formed upon a gate dielectric layer 202 disposed on a substrate 200, e.g., silicon-on-insulator (SOI) substrate (FIG. 2A). The SOI substrate 200 conventionally comprises a buried oxide layer 201 sandwiched between a silicon-containing layer 203 and silicon (Si) wafer 205 (all shown in FIG. 2A only). The silicon-containing layer 203 may be formed from at least one film of Si, SiGe, SiC, SiGeC, Si/SiGe, Si/SiC, Si/SiGeC, and the like. Such SOI substrates 200 are known to those skilled in the art. The gate dielectric layer 202 generally comprises one or more films of undoped and doped oxides, such $SiO_2$, SiON, $Al_2O_3$, $ZrO_2$, $HfO_2$, $Ta_2O_3$, $TiO_2$, silicates, perovskite-type oxides and mixtures thereof, among other dielectric materials. The polysilicon layer 204 and gate dielectric layer 202 are generally formed to a thickness of about 400 to 2000 and 10 to 100 Angstroms, respectively. The layers 204 and 202 may be deposited using any conventional vacuum deposition technique (e.g., physical vapor deposition (PVD), chemical vapor deposition (CVD), plasma enhanced CVD (PECVD), atomic layer deposition (ALD), and the like).

Figure 2B:
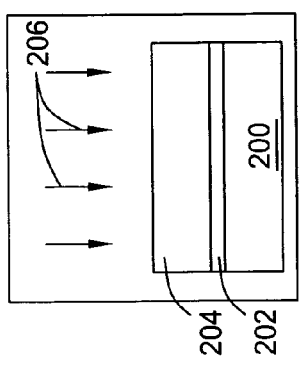
Figure 2A:
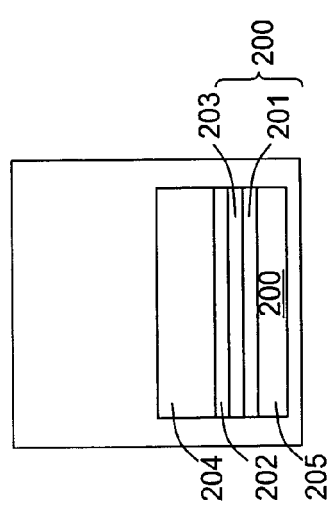

At step 104, impurities (i.e., dopants) are embedded in the polysilicon layer 204 (FIG. 2B). In one embodiment, step 104 performs an ion implantation process that uses an ion beam 206 comprising a controlled amount of at least one of As, P, B, Sb, Bi, In, Tl, Al, Ga, Ge, Sn and $N_2$. In such an embodiment, the selectively controlled dose may be in a range between about $1\times10^{14}$ and $5\times10^{15}$ ions/cm$^2$. Preferably, when the ion beam 206 comprises B, P As, and Sb, the dose is about $(5-20)\times10^{14}$, $(5-25)\times10^{14}$, $(5-35)$ and $(5-40)\times10^{14}$ ions/cm$^2$, respectively. In a further embodiment, P, As, Sb and Bi are used to dope the regions in the polysilicon layer 204 where NMOS transistors are being fabricated on the substrate 200, while B and Ge is used to dope the regions where the PMOS transistors are being fabricated, respectively. After silicidation of the polysilicon layer 204 (discussed below in reference to step 110), P, As, Sb and Bi facilitate conduction band control, while B and Ge impurities provide valence band control in the silicided material of gate electrodes of the transistors, respectively. In another embodiment, to obtain multiple work functions, lithographic masks may be used to expose selected regions in the polysilicon layer 204 to the ion beam 206. In an alternate embodiment, the impurities may be introduced using, e.g., a PVD or CVD process, either during step 102 or step 104.

At step 106, the polysilicon layer 204 is amorphized (FIG. 2C). In one exemplary embodiment, to amorphize the polysilicon, step 106 performs an ion implantation process that uses an ion beam 212 comprising a controlled amount of at least one of Si and Ge. Amorphization of the polysilicon may favorably increase impurity segregation at the polysilicon/silicide interface (discussed below in reference to step 110) of the impurities that were implanted, at step 104, in the layer 204. In some applications, amorphization of the polysilicon layer 204 is not needed and, as such, step 106 is considered optional.

At step 108, a gate structure 210 of the CMOS transistor being fabricated is formed on the substrate 200. FIG. 2D depicts the gate structure 210 that has been planarized using a chemical-mechanical polishing (CMP) process. The gate structure 210 may be formed using known methods in the art, e.g., lithographic, reactive ion etching, deposition, annealing, CMP, and other processes which are conventionally used to fabricate CMOS transistors. Such processes are disclosed, for example, in commonly assigned U.S. patent application Ser. No. 10/300,165, filed on Nov. 20, 2002 (Attorney docket number YOR920020183US1), which is incorporated herein by reference.

In one exemplary embodiment, the gate structure 210 comprises the gate dielectric layer 202, the polysilicon layer 204, raised source/drain (RSD) regions 216, insulative spacers 218 and 220, and a metallic layer 208 that is deposited upon the polysilicon layer 204. The metallic layer 208 may be formed from at least one of a metal and an alloy. The metal may be at least one of Ni, Co, Pt, Ti, Pd, W, Mo, and Ta; and the alloy may comprise at least one of C, Al, Ti, V, Cr, Mn, Fe, Co, Ni, Cu, Ge, Zr, Nb, Mo, Ru, Rh, Pd, Ag, In, Sn, Hf, Ta, W, Re, Ir, and Pt. A self-aligned silicide process (salicide) is used to consume the poly-Si of the gate electrode in a reaction with the metal layer to form a silicide metal gate electrode. The salicide process comprises the deposition of a blanket metal layer, a first low temperature anneal to form the first phase of the silicide, a selective wet etch to remove the non-reactive metal, and an optional second anneal at a higher temperature to form a lower resistance phase of the silicide (further discussed in step 110 in detail). In a further embodiment, the RSD regions 216 may be grown using a selective Si epitaxy process, implanted with appropriate dopants, and then metallized to form a silicide contact. In an alternate embodiment, the substrate 200 may be a Si wafer comprising drain and source regions of the CMOS transistor being formed thereon.

Figure 2E:
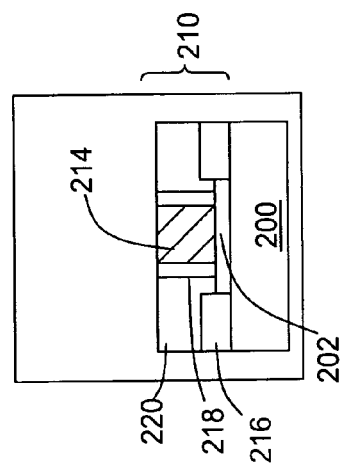
Figure 2D:
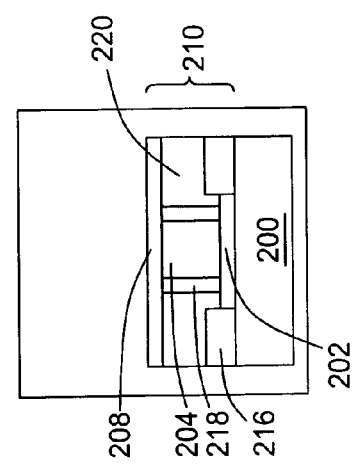

At step 110, the polysilicon layer 204 is converted to a silicide, thereby forming a silicide gate electrode 214 (FIG. 2E). In the depicted embodiment, during step 110, the polysilicon layer 204 and metallic layer 208 are entirely consumed and replaced with the silicide. In an alternate embodiment (not shown), a thickness of the metallic layer 208 may be selected such that silicide gate electrode 214 is composed of multiple silicide layers where the top most layer is a more metal rich silicide phase compared to the bottom layer.

Silicidation of the polysilicon layer 204 may be performed using, for example, an annealing process. In one exemplary embodiment, the annealing process is performed in atmosphere of at least one of an inert gas (e.g., He, Ar, and the like), $N_2$, and forming gas (i.e., solution of about (3–10) % of $H_2$ in $N_2$ or Ar). In a further embodiment, the annealing process for NiSi formation is performed at a pre-selected low substrate temperature (e.g., about 350 to 500 degrees Celsius) and for an extended duration of time, such as about 0.3 to 30 min. In an additional embodiment, the annealing process for $CoSi_2$ formation is performed at a pre-selected low substrate temperature (e.g., about 450 to 750 degrees Celsius) and for an extended duration of time, such as about 0.3 to 30 min. In another embodiment, the annealing process for PtSi and PdSi formation is performed at a pre-selected low substrate temperature (e.g., about 350 to 600 degrees Celsius) and for an extended duration of time, such as about 0.3 to 30 min. Such an annealing process may favorably increase solubility and segregation of the impurities in the silicide gate electrode 214 being formed, as well as lower the stress in the gate dielectric layer 202 and increase adhesion between the layer 202, electrode 214, and substrate 200. In one specific preferred embodiment, when the metallic layer 208 comprises Ni, the NiSi gate electrode is formed using the annealing process performed in atmosphere of $N_2$, at 450 degrees Celsius, and for a duration of approximately 15 min.

As the silicide forms, the implanted impurities tend to segregate into a boundary region between the silicide and the remaining polysilicon and are "plowed" towards the gate dielectric layer 202. When the silicide front reaches the gate dielectric layer 202, the impurities become fixed at the interface between the silicide and the dielectric layer 202, thus changing the workfunction of the gate structure 210, as well as electron mobility in the silicide gate electrode 214.

After the annealing process, the gate structure 210 comprises the silicide gate electrode 214 formed upon at least one monolayer of the implanted impurities that are disposed at an interface between the silicide gate electrode 214 and gate dielectric layer 202. Segregation of the impurities within the gate structure may readily be observed using, e.g., conventional secondary ion mass spectroscopy (SIMS) methodology.

In one exemplary embodiment, when the impurity was As, the workfunction and the peak electron mobility of the NiSi gate structure 210 were about −250 eV closer to the conduction band in Si and 2–10% greater, respectively, than the corresponding workfunction and electron mobility of the gate structure having a NiSi gate metal electrode formed from undoped polysilicon.

The work function of the silicide electrode is defined by the amount (i.e., dose) and material of the impurity that, at step 104, was implanted in the polysilicon layer 204. In general terms, a change, or shift, in the value of work function of the silicide gate electrode 214 is proportional to concentration of the impurities that are embedded in the silicide (discussed below in reference to FIG. 3). Using a controlled dose and material of the impurity, at step 104, the work function of the silicide gate electrode 214 may selectively be modified to specific values, such as the ones that facilitate pre-determined threshold voltages and optimal operation of the PMOS and NMOS transistors. In one exemplary embodiment, a threshold voltage (about 0.4V) of the NiSi silicide gate electrode 214 was selectively modified by at least −0.25V using controlled doping of the polysilicon layer 204 with As, as described above in reference to step 104. The corresponding maximum shiftranges for selectively controlled threshold voltages of the silicide gate electrode 214 doped with B, P, As and Sb were about 0.1V; 0.2V; 0.25 and 0.5V, respectively.

Upon completion of the annealing process, at step 112, the method 100 ends.

Figure 3:
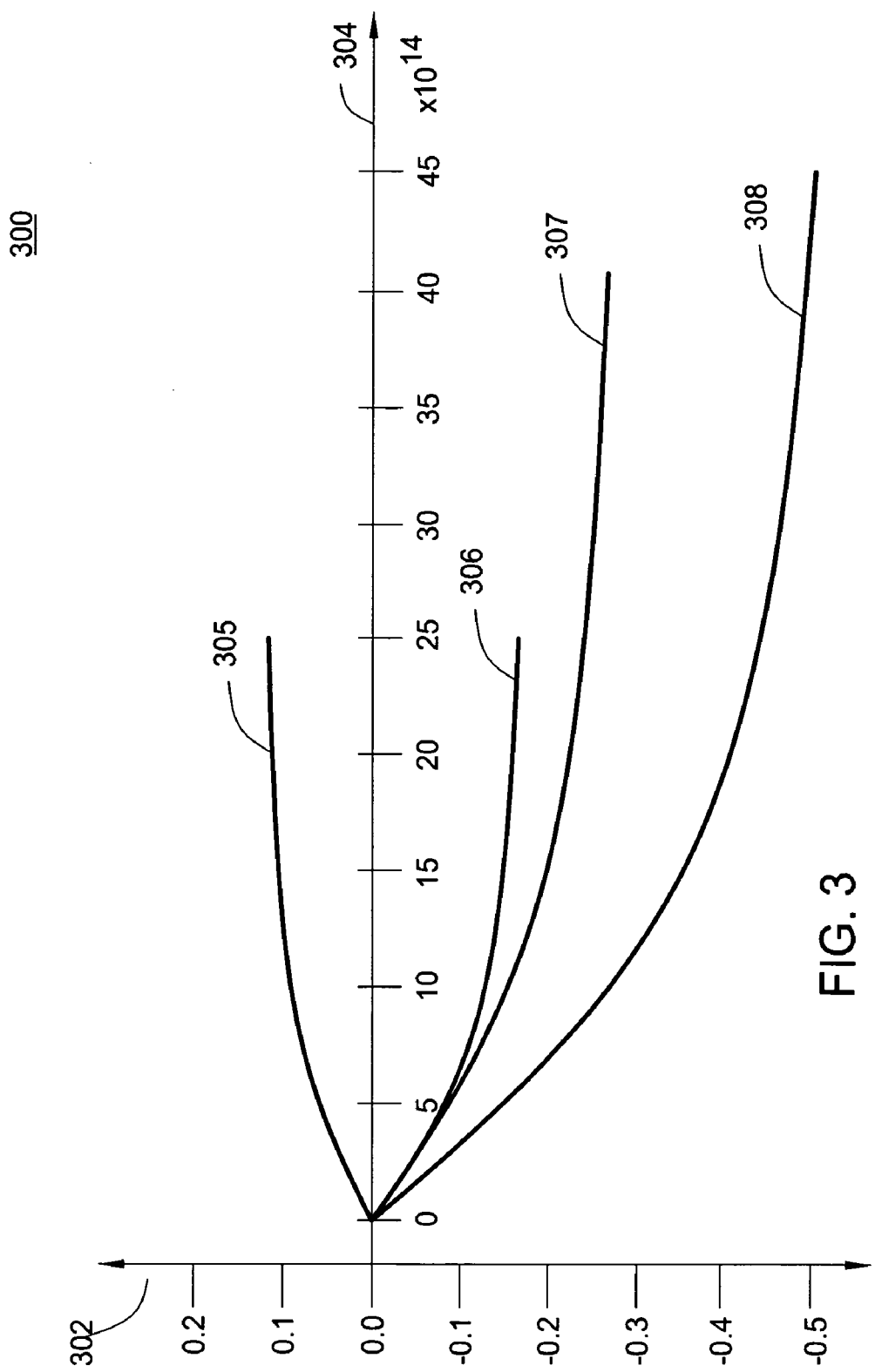
FIG. 3 depicts an exemplary diagram illustrating a work function of silicide gate electrodes of CMOS field effect transistors fabricated using the method of FIG. 1.

FIG. 3 depicts an exemplary graph 300 that illustrates dependence of the work function of the silicide gate electrode 214 from an amount of the impurity in the gate electrode. Specifically, in FIG. 3, a shift 302 (y-axis) in the work function of the gate electrode 214 is plotted versus a dose 304 of the impurity that, at step 104 of the method 100 (discussed in reference to FIG. 1 above), was implanted in the polysilicon layer 204. Herein, the shift 302 is expressed in the units of "eV" (electron-volt), the dose 304 is expressed in the units of "ions/cm$^2$", and exemplary traces 305–308 relate the B, P, As and Sb impurities, respectively, in the NiSi gate electrode 214.

While the foregoing is directed to the illustrative embodiment of the present invention, other and further embodiments of the invention may be devised without departing from the basic scope thereof, and the scope thereof is determined by the claims that follow.

The invention claimed is:

1. A method of fabricating a complementary metal oxide semiconductor (CMOS) field effect transistor, comprising the steps of:
    (a) providing a substrate;
    (b) providing on said substrate a polysilicon layer formed upon a gate dielectric layer;
    (c) doping the polysilicon layer using at least one dopant;
    (d) forming a gate structure for the transistor having a polysilicon gate electrode and raised source and drain regions;
    (e) depositing on the polysilicon gate electrode at least one of a metal and an alloy; and
    (f) siliciding the polysilicon gate electrode to form a silicide and at least one monolayer of the at least one dopant at an interface between the gate dielectric layer and the silicide.

2. The method of claim 1, wherein the doping step (c) is performed after the forming step (d).

3. The method of claim 1, wherein the at least one dopant comprises at least one of As, P, B, Sb, Bi, In, Tl, Al, Ga, Ge, Sn and $N_2$.

4. The method of claim 1, wherein the doping step (c) dopes the polysilicon layer using Sb as said at least one dopant.

5. The method of claim 1, wherein the doping step (c) dopes the polysilicon layer using an ion implantation process.

6. The method of claim 5, wherein the doping step (c) dopes the polysilicon layer using a pre-determined dose in a range from about $1 \times 10^{14}$ to $4 \times 10^{15}$ ions/cm$^2$.

7. The method of claim 1, wherein the forming step (d) further comprises the step of:
    amorphizing the polysilicon gate electrode.

8. The method of claim 7, wherein said amorphizing step comprises the step of:
    performing an ion implantation process using at least one of Si and Ge.

9. The method of claim 1, wherein said at least one of the metal comprises at least one of Ni, Co, Pt, Ti, Pd, W, Mo, and Ta.

10. The method of claim 1, wherein said at least one of the metal comprises Ni.

11. The method of claim 1, wherein said at least one of the metal comprises Co.

12. The method of claim 1, wherein said at least one of the alloy comprises at least one of C, Al, Ti, V, Cr, Mn, Fe, Co, Ni, Cu, Ge, Zr, Nb, Mo, Ru, Rh, Pd, Ag, In, Sn, Hf, Ta, W, Re, Ir, and Pt.

13. The method of claim 1, wherein said siliciding step employs an annealing process.

14. The method of claim 13, wherein the annealing process is performed at a substrate temperature of about 350 to 750 degrees Celsius for a duration of about 0.3 to 30 min.

* * * * *